United States Patent
Miaille

(10) Patent No.: US 7,358,743 B2
(45) Date of Patent: Apr. 15, 2008

(54) ACCUMULATED CURRENT COUNTER AND METHOD THEREOF

(75) Inventor: Gerald P. Miaille, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/380,479

(22) Filed: Apr. 27, 2006

(65) Prior Publication Data

US 2007/0252575 A1     Nov. 1, 2007

(51) Int. Cl.
G01R 31/08    (2006.01)
G01R 19/00    (2006.01)
G01N 27/416   (2006.01)
H02J 7/00     (2006.01)

(52) U.S. Cl. .................. 324/522; 324/76.11; 324/426; 320/132

(58) Field of Classification Search ................ 324/522, 324/76.11, 426; 320/132
See application file for complete search history.

(56) References Cited

U.S. PATENT DOCUMENTS 5,774,733 A * 6/1998 Nolan et al. ................. 713/300
6,025,695 A * 2/2000 Friel et al. ................... 320/106

* cited by examiner

*Primary Examiner*—Andrew H. Hirshfeld
*Assistant Examiner*—Amy He
(74) *Attorney, Agent, or Firm*—Michael J. Balconi-Lamica

(57) ABSTRACT

An accumulated current counter (11) includes a sense resistor (30) configured for being coupled in series between an electronic circuit (13) and a power source (12). The sense resistor is further for use in sensing a voltage ($V_{IN(i)}$) across the sense resistor as a function of a current (Ibatt) provided via the power source. An incremental counter (16) is coupled to the sense resistor for incrementally counting an amount of current, corresponding to an average value of charge Q, going (i) into or (ii) out of the power source. A register (63) accumulates a representation of the incrementally counted current. In one embodiment, the representation of incrementally counted current corresponds to a remaining power source life in hours and minutes.

18 Claims, 2 Drawing Sheets

ACCUMULATED CURRENT COUNTER AND METHOD THEREOF

BACKGROUND

The present disclosures relate to power management in electronic devices, and more particularly, to an accumulated current counter and method thereof for use with an electronic device.

In cellular phones, an accurate estimation of the remaining talk/standby time is generally not provided. Cellular phone designers typically use voltage measurement to predict a remaining use time of the phone. As a result, an end user typically ends up with a four-bar graph indicator as an indication of a remaining autonomy of the cellular phone battery.

Prior techniques for predicting a remaining talk/standby time have included use of either a voltage-to-frequency converter (VFC) or an analog-to-digital converter (ADC) to measure the voltage across a sense resistor.

Accordingly, there is a need for an improved method and apparatus for overcoming the problems in the art as discussed above.

BRIEF DESCRIPTION OF THE DRAWINGS

The present invention is illustrated by way of example and not limited by the accompanying figures, in which like references indicate similar elements, and in which.

The use of the same reference symbols in different drawings indicates similar or identical items. Skilled artisans will also appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The accumulated current counter according to the embodiments of the present disclosure calculates an average value of charge Q going in/out of a battery. The accumulated current counter can further be configured to handle a wide measurement dynamic range, for example, from −2 A to 2 A with 1 mA/100 μA steps (i.e., 12 bits resolution). With a low value sense resistor, for example, on the order of 20 mOhm, the low value implies low offset and low noise circuitry in order to sense very low voltages, for example, on the order of 20 μV to 40 mV.

In addition, the accumulated current counter operates with low power consumption in order to keep the power management functionality working in stand-by mode of a corresponding electronic device. Furthermore, in the context of a cellular phone, measurement of the charge contained in the battery enables prediction of a remaining talk-time and/or stand-by time of the electronic device, in hour and minutes, further for being made available or communicated to an end user of the electronic device.

Figure 1:
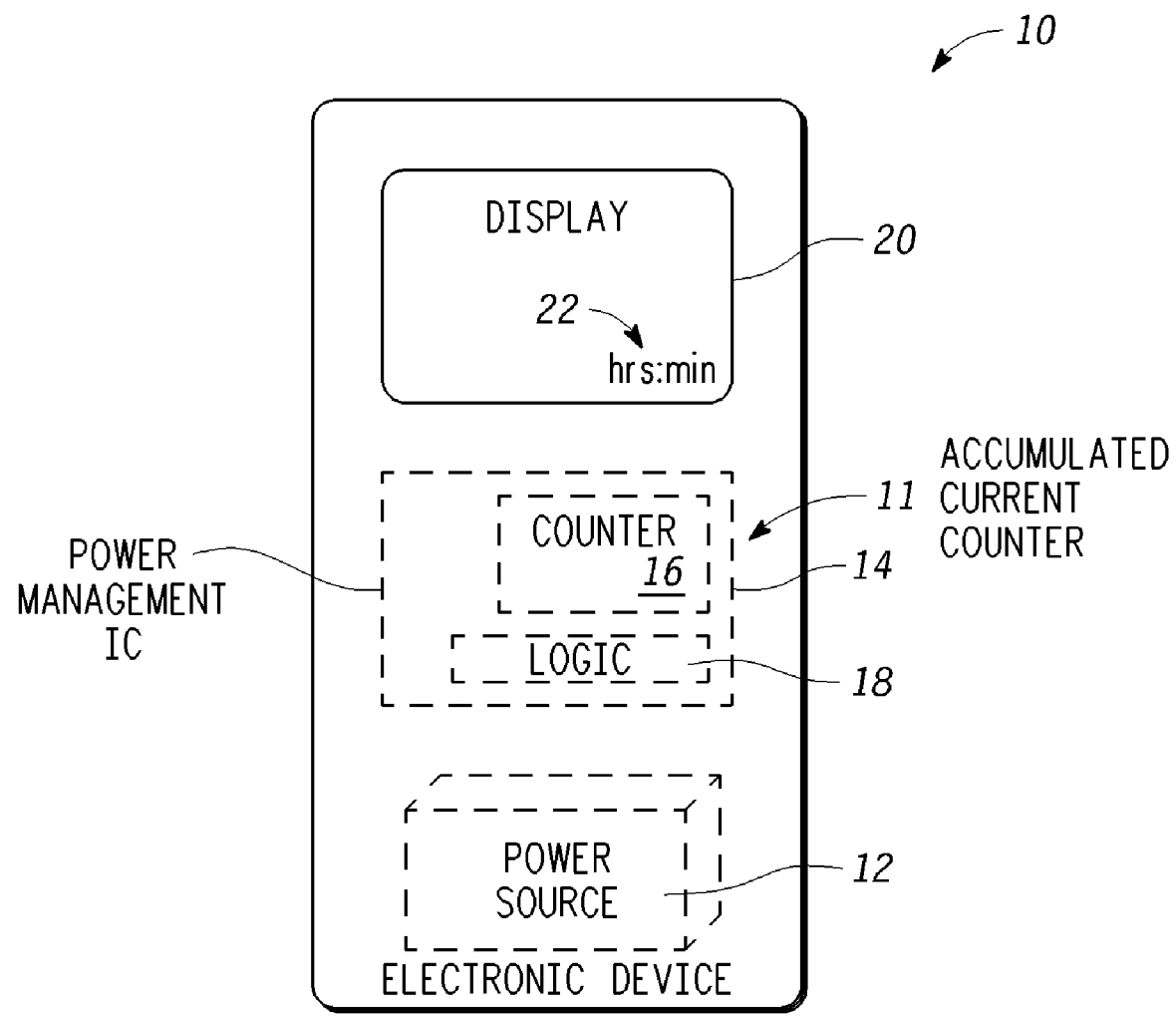
FIG. 1 is a schematic block diagram view of an electronic device including a power management IC with an accumulated current counter according to one embodiment of the present disclosure.

FIG. 1 is a schematic block diagram view of an electronic device 10 including a power management IC with an accumulated current counter according to one embodiment of the present disclosure. In one embodiment, electronic device 10 comprises, for example, a cellular phone. Electronic device 10 includes a power source 12, a power management integrated circuit 14 and a display 20. In one embodiment, power source 12 comprises a battery. The power management IC 14 includes an accumulated current counter 16 and control/postprocessing logic 18. In one embodiment, accumulated current counter 16 comprises an incremental converter. Responsive to a monitoring of charge in/out of power source 12 via accumulated current counter 16, the control/postprocessing logic 18 provides information to display 20 for providing a display of a remaining power source life, generally indicated by reference numeral 22. For example, in one embodiment, the remaining power source life is provided in a format of hours and minutes (i.e., hrs:min).

Figure 2:
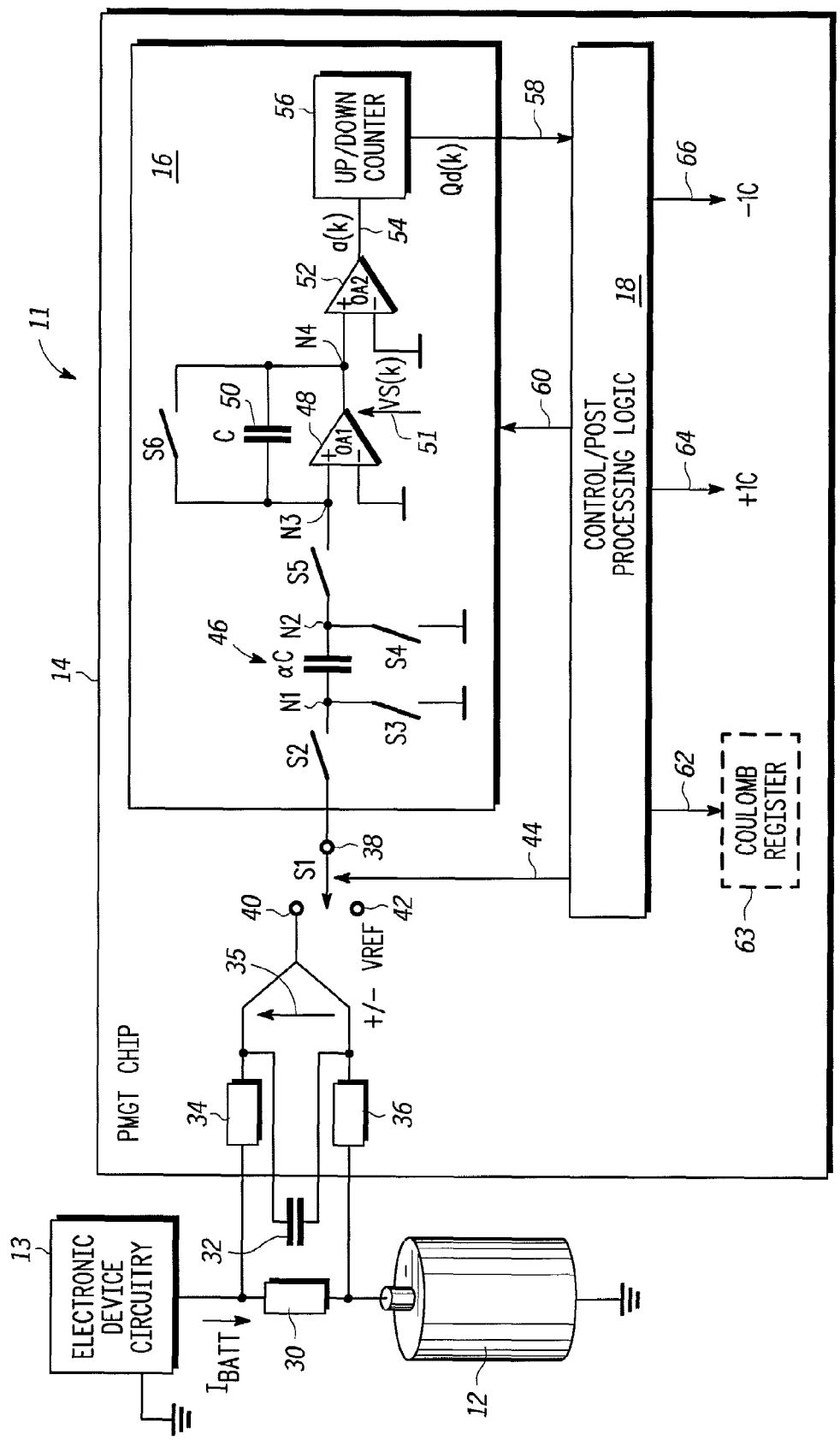
FIG. 2 is a schematic block diagram view of the power management IC of FIG. 1 in further detail, using an incremental converter as an accumulated current counter according to an embodiment of the present disclosure.

FIG. 2 is a schematic block diagram view of the power management IC 14 of FIG. 1 in further detail, using an incremental converter as an accumulated current counter according to an embodiment of the present disclosure. A sense resistor (Rs) 30 is coupled to an input of the power source 12 for sensing a voltage across the resistor as a function of the battery current (Ibatt). In one embodiment, sense resistor 30 comprises a resistance on the order of 20 mOhm. Coupled in parallel with sense resistor 30 is a single pole RC filter that comprises an external capacitor 32 and internal resistances (34,36). The single pole RC filter allows for integrating high frequency spikes and provides an anti-aliasing filtering function on the voltage ($V_{IN(i)}$) across sense resistor 30, indicated by the arrow and reference numeral 35.

Internal to the power management IC 14, a switch S1 couples node 38 between node 40 and node 42. Node 40 is coupled to the input voltage across sense resistor 30, represented by $V_{IN(i)}$ and reference numeral 35. Node 42 is coupled to a voltage reference (+/−VREF). A signal on control line 44 controls the state of switch S1 at any given point in time, according to the control/postprocessing logic 18.

In one embodiment, accumulated current counter 16 comprises an incremental converter. The incremental converter includes a switched capacitor configuration of switches S2, S3, S4, S5, S6, capacitors 46 and 50, op-amps 48 and 52, and an up/down counter 56 particular, node 38 of switch S1 is coupled to node N1 via switch S2. Node N1 is coupled to a circuit ground potential via switch S3. Capacitor 46 (denoted αC) is coupled between node N1 and node N2. Node N2 is coupled to the circuit ground potential via switch S4. In addition, node N2 is coupled to node N3 via switch S5. Node N3 is coupled to a non-inverting input of op-amp OA1, indicated by reference numeral 48. The inverting input of op-amp OA1 is coupled to the circuit ground potential.

Switch S6 is coupled between node N3 and node N4. In addition, capacitor 50 (denoted C) is also coupled between node N3 and node N4. Node N4 is coupled to the output of op-amp OA1, as well as coupled to the non-inverting input of op-amp OA2, indicated by reference numeral 52. The inverting input of op-amp OA2 is coupled to the circuit ground potential. In addition, a voltage VS(k) at the output of the corresponding integrator is generally indicated by an arrow and reference numeral 51. In addition, the output of op-amp OA2, denoted by reference numeral 54, is input to up/down counter 56. The output Qd(k) of up/down counter 56 is provided on output 58.

Control/postprocessing logic 18 comprises suitable logic or digital signal processor (DSP) that is responsive to the output Qd(k) on signal line 58 of up/down counter 56 for providing signals to a coulomb register (not shown) on signal line 62, as well as, a positive coulomb increment signal (+1 C) on signal line 64 and a negative coulomb increment signal (−1 C) on signal line 66. The coulomb register can comprise any suitable register or memory location for storing data representative of an amount of charge contained within power source 12 at any given time. Control/postprocessing logic 18 further provides a suitable clock signal on signal line 60, as well as, a switch control signal line 44, for controlling a state of switch S1.

In operation, the voltage across the sense resistor is first filtered using a single pole RC filter (e.g., an external capacitor) allowing to integrate high frequency spikes and providing anti-aliasing filtering function. The filtered voltage is then provided to a first order incremental converter using the switch capacitor technology clocked with the real-time clock (RTC) of the electronic device (e.g., 32 KHz). The operation of the first order incremental converter is as follows: (1) the input voltage $V_{IN(i)}$ is first integrated; (2) the sign of the output of the integrator 48 is sensed by the comparator 52; (3) the VREF voltage 42 is added/substracted depending on the output of the comparator 52; and (4) the counter 56 is (a) incremented or (b) decremented depending on the sign of the comparator 52.

To perform a compensation of the offset and gain of the integrator's operational transconductance amplifier (OTA) and cancel its (1/f) noise, autozeroing offset compensation is used. In one embodiment, a digital offset compensation is applied, thus allowing the embodiment to decrease remaining offset to approximately 1 µV.

After N cycles (i.e., 2·N clock periods), the voltage at the output of the integrator 48 is given by:

$$VS(N) = \alpha \sum_{i=0}^{N-1} Rs \cdot Ibatt(i) - \alpha \sum_{i=0}^{N-1} a(i) \cdot VREF$$

with VIN(i)=Rs·Ibatt(i). This leads to the equation:

$$Qin(N) = \frac{VREF}{Rs \cdot Fclk} Qd(N) + \frac{VS(N)}{\alpha Rs \cdot Fclk} \quad (1)$$

Where Qin is the analog charge which was (a) injected in or (b) retrieved from the battery and $$Qd = \sum_{i=0}^{N-1} a(i).$$

Accordingly, equation (1) describes a quantization system of a coulomb counting function that can be implemented via the accumulated current counter according to the embodiments of the present disclosure, wherein the quantization system includes (i) a digital output Qd(N), (ii) an increment $$\frac{VREF}{Rs \cdot Fclk},$$

(iii) a quantization error $$\frac{VS(N)}{\alpha Rs \cdot Fclk},$$

and (iv) analog charge Qin(N).

The accumulated current counter according to the embodiments of the present disclosure provide for one or more various advantages. For example, with a clock frequency (Fclk) of 32 KHz, the quantization error is smaller than 5 mCoulomb. In addition, for a typical battery having a capacity on the order of three thousand (3,000) Coulomb, the theoretical accuracy of the accumulated current counter embodiments of the present disclosure is on the order of 1.67 ppm. Furthermore, the gain error of the accumulated current counter does not depend on the matching of the capacitances of the integrator. The limiting effect due to the offset/gain of the OTA in the integrator can be improved, for example, by using the Nagaraj offset and gain compensation. Still further, the low frequency operation of the embodiments allows the achieving of a gain band width (GBW) requirement of consuming less than 5 µA and thus enables the accumulated current counter to be powered ON and measure the standby power consumption of the electronic device (e.g., mobile phone).

In addition, the averaging capability of the first order incremental converter helps the system to be extremely robust regarding the noise generated by the switched capacitor (SWCAP) integrator or the input signal noise. Theoretically, the incremental converter is able to achieve a high resolution (i.e, the integration time is very large so the oversampling rate is very large also) while performing an averaging at a rate of one half the clock frequency (Fclk/2), (e.g., 16 KHz).

According to one embodiment of the present disclosure, an accumulated current counter provides an accurate estimation of a remaining talk/standby time (i.e., in hours and minutes) of an electronic device, corresponding to a remaining power supply or battery life. In particular, the accumulated current counter calculates the amount of charge(s) in or out of a power supply (e.g., a battery). In addition, the accumulated current counter comprises an architecture that implements a low-cost coulomb counting function without the need for an accurate capacitance and current. Accordingly, no trimming is required.

The accumulated current counter architecture, according to the embodiments of the disclosure, enables an accumulated current counter having very low power consumption, on the order of less than five micro-amps (5 µA). As a result, the accumulated current counter can be allowed to remain ON (i.e., powered by the power supply) for an extended duration of time, including for example, all time that a corresponding electronic device is ON. Furthermore, the implementations of an accumulated current counter according to the embodiments of the present disclosure are cost efficient.

In one embodiment, the accumulated current counter and associated architecture operates similar to a multi-ramp converter, wherein the accuracy and power consumption of the accumulated current counter are drastically improved. In addition, the accumulated current counter architecture makes use of the fact that a first order incremental converter has no tones.

The accumulated current counter architecture includes a first order incremental converter, such as a sigma delta with a reset, configured for integrating all the time the voltage across a sense resistor. The first order incremental converter integrates the voltage across the sense resistor to measure the current coming in or out of the power supply (i.e., battery). The digital output of the incremental converter directly provides an amount of charge coming in or out of the power supply.

The accumulated current counter architecture can be implemented as a cost-efficient coulomb counting function for use in a power management integrated circuit (IC) of an electronic device, for example, a cellular phone. As a result, a device user can be informed of the remaining battery autonomy of a battery within such an electronic device, in hours and minutes. The accumulated current counter architecture can be also be implemented as a battery monitor of an electronic device. As disclosed herein, an accumulated current counter comprises: a sense resistor configured (i) for being coupled in series between an electronic circuit and a power source, and (ii) for use in sensing a voltage across the sense resistor as a function of a current provided via the power source; means coupled to the sense resistor for incrementally counting an amount of current, corresponding to an average value of charge Q, going (i) into or (ii) out of the power source; and a register for accumulating a representation of the incrementally counted current. In one embodiment, the incremental counting means counts in incremental steps over a dynamic range of current on the order of minus two amps (−2 A) to plus two amps (+2 A). In addition, the incremental steps can comprise steps selected from within a range of 1 mA to 100 µA steps.

In another embodiment, the incremental counting means comprises an incremental converter, wherein the incremental converter can comprise a first order incremental converter. The incremental converter can further comprise a switched capacitor configuration of switches, capacitors, op-amps, and an up/down counter.

In yet another embodiment, the accumulated current counter further comprises a single pole RC filter coupled in parallel with the sense resistor, wherein the single pole RC filter integrates high frequency spikes and provides an anti-aliasing filtering function on the voltage across the sense resistor. A switch S1 is responsive to a control signal for coupling an incremental converter input node between (i) a sense resistor voltage node of the single pole RC filter or (ii) a voltage reference (+/−$V_{REF}$) node. In addition, control/postprocessing logic is coupled between the incremental converter and the register, the control/postprocessing logic being responsive to the incremental converter for providing data signals to the register, including a positive coulomb increment signal (+1 C) and a negative coulomb increment signal (−1 C), wherein a content of the register is representative of a remaining power source life.

In another embodiment, the incremental converter comprises: a switch S2 for coupling an input node of the incremental converter to a node N1; a switch S3 for coupling node N1 to a circuit ground potential; a capacitor αC coupled between node N1 and a node N2; a switch S4 for coupling node N2 to the circuit ground potential; a switch S5 for coupling node N2 to a node N3; a first op-amp OA1 having a non-inverting input, an inverting input, and an output, wherein node N3 is coupled to the non-inverting input of op-amp OA1, the inverting input of op-amp OA1 is coupled to the circuit ground potential, and the output of op-amp OA1 is coupled to a node N4; a switch S6 for coupling node N3 to node N4; a capacitor C coupled between node N3 and node N4; a second op-amp OA2 having a non-inverting input, an inverting input, and an output, wherein node N4 is coupled to the non-inverting input of op-amp OA2, the inverting input of op-amp OA2 is coupled to the circuit ground potential; and an up/down counter having an input and an output, wherein the output of op-amp OA2 is coupled to the input of the up/down counter and wherein the output of up/down counter is representative of a digital output quantity of charge Qd(k).

According to yet another embodiment, a method of counting an accumulated current comprises coupling a sense resistor in series between an electronic circuit and a power source; sensing a voltage across the sense resistor as a function of a current provided via the power source; incrementally counting via an incremental converter an amount of current, corresponding to an average value of charge Q, going (i) into or (ii) out of the power source; and accumulating a representation of the incrementally counted current into a register. In addition, incrementally counting can include counting in incremental steps over a dynamic range of current on the order of minus two amps (−2 A) to plus two amps (+2 A). Furthermore, the incremental steps can comprise steps selected from within a range of 1 mA to 100 µA steps.

In another embodiment, incremental counting via the incremental converter further comprises incremental counting via a first order incremental converter. Incremental counting via the first order incremental converter can comprise counting via a switched capacitor configuration of switches, capacitors, op-amps, and an up/down counter.

In a further embodiment, implementing accumulated current counting occurs within a power management integrated circuit of an electronic device and also includes displaying an output on a display of the electronic device. The output is representative of a power source characteristic as a function of the accumulated current counting. The method also includes using control/postprocessing logic within the power management integrated circuit, responsive to the accumulated representation of the incrementally counted current in the register, for providing the output representative of the power source characteristic as a function of the accumulated current counting. In one embodiment, the power source characteristic corresponds to a remaining power source life in hours and minutes.

In the foregoing specification, the disclosure has been described with reference to the various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments. For example, one embodiment of the present disclosure includes an accumulated current counter used for any battery power-supplied electronic device or apparatus, such as a cellular phone, MP3 player, laptop computer, or other similar device. The embodiments of the present disclosure still further comprise an integrated circuit as discussed herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of

The invention claimed is:

1. An accumulated current counter comprising:
a sense resistor configured (i) for being coupled in series between an electronic circuit and a power source, and (ii) for use in sensing a voltage across the sense resistor as a function of a current provided via the power source;
means coupled to the sense resistor for incrementally counting an amount of current, corresponding to an average value of charge Q, going (i) into or (ii) out of the power source, wherein the incremental counting means comprises an incremental converter;
a register for accumulating a representation of the incrementally counted current;
a single pole RC filter coupled in parallel with the sense resistor, wherein the single pole RC filter integrates high frequency spikes and provides an anti-aliasing filtering function on the voltage across the sense resistor;
a switch (S1) responsive to a control signal for coupling an incremental converter input node between (i) a sense resistor voltage node of the single pole RC filter or (ii) a voltage reference ($+/-V_{REF}$) node; and
control/postprocessing logic coupled between the incremental converter and the register, the control/postprocessing logic being responsive to the incremental converter for providing data signals to the register, including a positive coulomb increment signal (+1 C) and a negative coulomb increment signal (−1 C), wherein a content of the register is representative of a remaining power source life.

2. The accumulated current counter of claim 1, wherein the incremental counting means counts in incremental steps over a dynamic range of current on the order of minus two amps (−2 A) to plus two amps (+2 A).

3. The accumulated current counter of claim 2, wherein the incremental steps comprise steps selected from within a range of 1 mA to 100 µA steps.

4. The accumulated current counter of claim 1, wherein the incremental converter comprises a first order incremental converter.

5. The accumulated current counter of claim 1, wherein the incremental converter comprises a switched capacitor configuration of switches, capacitors, op-amps, and an up/down counter.

6. The accumulated current counter of claim 1, wherein the sense resistor comprises a 20 mOhm resistor.

7. The accumulated current counter of claim 1, wherein the accumulated current counter is implemented within an electronic device, the electronic device including a display and a power management integrated circuit, further wherein the power management integrated circuit includes the incremental counting means.

8. The accumulated current counter of claim 7, wherein the power management integrated circuit further includes control/postprocessing logic coupled between the incremental counting means and the register, the control/postprocessing logic being responsive to the incremental counting means for providing an output representative of a remaining power source life.

9. The accumulated current counter of claim 8, wherein the output representative of the remaining power source life corresponds to a remaining power source life in hours and minutes.

10. An accumulated current counter comprising:
a sense resistor configured (i) for being coupled in series between an electronic circuit and a power source, and (ii) for use in sensing a voltage across the sense resistor as a function of a current provided via the power source;
means coupled to the sense resistor for incrementally counting an amount of current, corresponding to an average value of charge Q, going (i) into or (ii) out of the power source, wherein the incremental counting means comprises an incremental converter; and
a register for accumulating a representation of the incrementally counted current, further wherein the incremental converter comprises:
a switch (S2) for coupling an input node of the incremental converter to a node (N1);
a switch (S3) for coupling node (N1) to a circuit ground potential;
a capacitor (αC) coupled between node (N1) and a node (N2);
a switch (S4) for coupling node (N2) to the circuit ground potential;
a switch (S5) for coupling node (N2) to a node (N3);
a first op-amp OA1 having a non-inverting input, an inverting input, and an output, wherein node (N3) is coupled to the non-inverting input of op-amp (OA1), the inverting input of op-amp (OA1) is coupled to the circuit ground potential, and the output of op-amp (OA1) is coupled to a node (N4);
a switch (S6) for coupling node (N3) to node (N4);
a capacitor (C) coupled between node (N3) and node (N4);
a second op-amp (OA2) having a non-inverting input, an inverting input, and an output, wherein node (N4) is coupled to the non-inverting input of op-amp (OA2), the inverting input of op-amp (OA2) is coupled to the circuit ground potential; and
an up/down counter having an input and an output, wherein the output of op-amp (OA2) is coupled to the input of the up/down counter and wherein the output of up/down counter is representative of a digital output quantity of charge (Qd(k).

11. A method of counting an accumulated current comprising:
coupling a sense resistor in series between an electronic circuit and a power source;
sensing a voltage across the sense resistor as a function of a current provided via the power source;
incrementally counting via an incremental converter an amount of current, corresponding to an average value of charge Q, going (i) into or (ii) out of the power source; and
accumulating a representation of the incrementally counted current into a register, the method further comprising:
coupling a single pole RC filter in parallel with the sense resistor, wherein the single pole RC filter integrates high frequency spikes and provides an anti-aliasing filtering function on the voltage across the sense resistor;
coupling, via a switch (S1) responsive to a control signal, an incremental converter input node between (i) a sense resistor voltage node of the single pole RC filter or (ii) a voltage reference ($+/-V_{REF}$) node; and
coupling control/postprocessing logic between the incremental converter and the register, the control/postprocessing logic being responsive to the incremental converter for providing data signals to the register, including a positive coulomb increment signal (+1C) and a negative coulomb increment signal (−1C), wherein a content of the register is representative of a remaining power source life.

12. The method of claim 11, wherein incrementally counting includes counting in incremental steps over a dynamic range of current on the order of minus two amps (−2A) to plus two amps (+2A).

13. The method of claim 12, wherein the incremental steps comprise steps selected from within a range of 1 mA to 100 µA steps.

14. The method of claim 11, wherein incremental counting via the incremental converter further comprises incremental counting via a first order incremental converter.

15. The method of claim 14, further wherein incremental counting via the first order incremental converter comprises counting via a switched capacitor configuration of switches, capacitors, op-amps, and an up/down counter.

16. The method of claim 11, further comprising:
 implementing accumulated current counting within a power management integrated circuit of an electronic device; and
 displaying an output on a display of the electronic device, wherein the output is representative of a power source characteristic as a function of the accumulated current counting.

17. The method of claim 16, further comprising:
 using the control/postprocessing logic within the power management integrated circuit, responsive to the accumulated representation of the incrementally counted current in the register, for providing the output representative of the power source characteristic as a function of the accumulated current counting, the power source characteristic corresponding to a remaining power source life.

18. The method of claim 17, wherein the output representative of the remaining power source life corresponds to a remaining power source life in hours and minutes.

\* \* \* \* \*